United States Patent
Schoen et al.

(10) Patent No.: US 7,755,367 B2
(45) Date of Patent: Jul. 13, 2010

(54) SILICON MEMS RESONATORS

(75) Inventors: Florian Schoen, Munich (DE); Markus Loehndorf, Munich (DE)

(73) Assignee: Infineon Technologies, AG, Neubiberg (DE)

( * ) Notice: Subject to any disclaimer, the term of this patent is extended or adjusted under 35 U.S.C. 154(b) by 110 days.

(21) Appl. No.: 12/131,145

(22) Filed: Jun. 2, 2008

(65) Prior Publication Data

US 2009/0295406 A1    Dec. 3, 2009

(51) Int. Cl.
*G01R 27/04* (2006.01)
(52) U.S. Cl. .................. 324/633; 324/636; 73/504.02
(58) Field of Classification Search ............. 324/633, 324/636, 76.49; 73/504.02
See application file for complete search history.

(56) References Cited

U.S. PATENT DOCUMENTS 6,940,370 B2    9/2005  Bircumshaw et al.
2006/0158268 A1  7/2006  McCorquodale et al.
2007/0125161 A1  6/2007  Bryzek et al.
2007/0152537 A1  7/2007  Yamaguchi et al.
2008/0202237 A1*  8/2008  Hammerschmidt ...... 73/504.04

OTHER PUBLICATIONS

Kaajakari et al., "Phase Noise in Capacitively Coupled Micromechanical Oscillators", IEEE Transactions on Ultrasonics, Ferroelectrics, and Frquency Control, vol. 52, No, 12, Dec. 2005 (10 pages).

* cited by examiner

*Primary Examiner*—Vincent Q Nguyen
(74) *Attorney, Agent, or Firm*—Patterson Thuente Christensen Pedersen, P.A.

(57) ABSTRACT

The invention relates to MEMS resonators. In one embodiment, an integrated resonator and sensor device includes a micro-electromechanical system (MEMS) resonator, and an anchor portion coupled to the MEMS resonator and configured to allow resonance of the MEMS resonator in a first plane of motion and movement of the MEMS resonator in a second plane of motion. In other embodiments, additional apparatuses, devices, systems and methods are disclosed.

15 Claims, 4 Drawing Sheets

SILICON MEMS RESONATORS

BACKGROUND

Reference frequency generation and acceleration sensing are typically implemented by two separate discrete components in devices which require both. A quartz crystal resonator is most often used to generate the reference frequency, while acceleration sensing is often measured by using electrostatic, piezoelectric or piezoresistive principles. Many applications also use shock sensing, which provides for the detection of rapid acceleration changes and can be described as a wide-band acceleration sensor.

Using separate components for frequency generation and sensing, however, takes up more space and also can require more power. These are significant disadvantages, particularly in applications in which a small size as well as low power consumption are desired or required, such as in wheel-mounted tire pressure monitoring systems (TPMS).

SUMMARY

Embodiments of the invention are related to MEMS resonators. In one embodiment, an integrated resonator and sensor device comprises a micro-electromechanical system (MEMS) resonator, and an anchor portion coupled to the MEMS resonator and configured to allow resonance of the MEMS resonator in a first plane of motion and movement of the MEMS resonator in a second plane of motion.

In another embodiment, a method comprises determining a frequency reference from movement of a micro-electromechanical system (MEMS) resonating element in a first plane of motion, and sensing a condition from movement of the MEMS resonating element in a second plane of motion.

Further embodiments comprise additional apparatuses, devices, systems and methods.

BRIEF DESCRIPTION OF THE DRAWINGS

The invention may be more completely understood from the following detailed description of various embodiments in connection with the accompanying drawings, in which.

Figure 1:
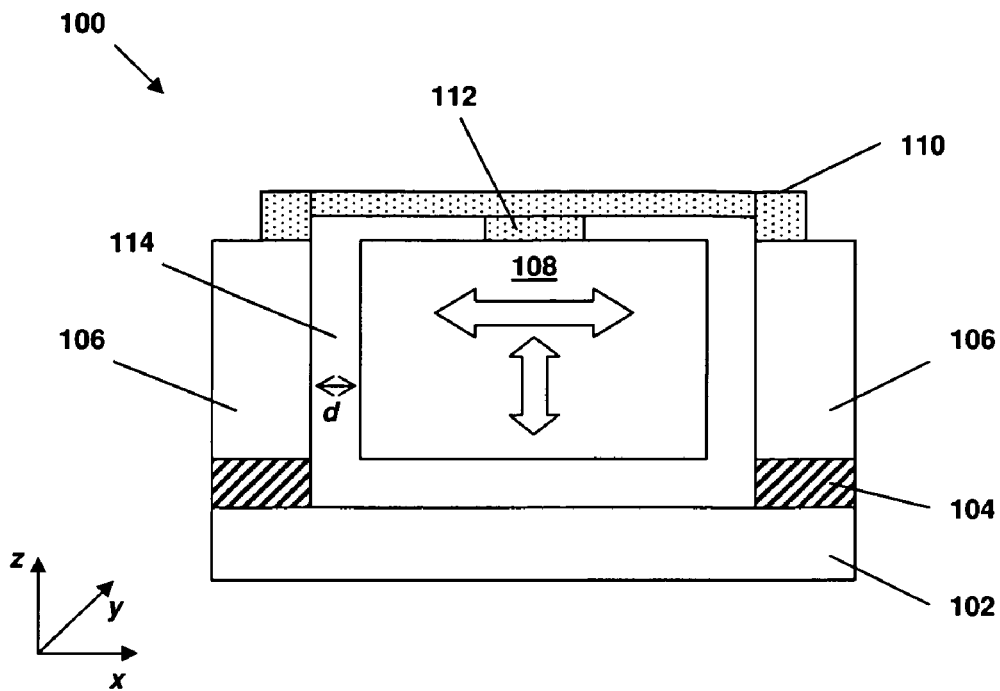
FIG. 1 is a diagram of a resonating device according to one embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of the invention relate to micro-electromechanical system (MEMS) technology, such as integrated silicon resonator and sensor devices. Embodiments of the invention have applicability to a wide variety of devices and systems, such tire pressure measurement systems (TPMS).

Various embodiments of the invention can be more readily understood by reference to FIGS. 1-7 and the following description. While the invention is not necessarily limited to the specifically depicted application(s), the invention will be better appreciated using a discussion of exemplary embodiments in specific contexts.

Embodiments of the invention integrate a precise, stable and mechanically robust reference frequency generator and a shock, acceleration or other sensor in one single silicon micro-electromechanical system (MEMS) device. The device can be implemented as a system-on-chip (SoC) or system-in-package (SiP) together with an application-specific integrated circuit (ASIC) in various embodiments. The sensing component is integrated without affecting the accuracy and precision of the reference frequency generator. Such integration saves space and power, which is especially important in low power applications as well as in applications in which high acceleration changes (e.g., in the range of 1000 g and higher) can be expected, such as in TPMS.

In FIG. 1, one embodiment of a silicon MEMS resonator device 100 is depicted. Resonator device 100 is formed on a substrate 102, and an insulating layer 104, such as silicon dioxide in one embodiment, is formed on substrate 102. An electrode 106 is formed on layer 104.

Resonator device 100 further comprises a resonating element 108 coupled to a top sealing portion 110 by an anchor 112. Resonating element 108 is separated from electrode 106 by a cavity 114. Resonating element 108 moves or resonates in the x-y plane, generating a reference frequency. Resonators can be designed such that they resonate in other planes, as in other embodiments.

In one embodiment, resonating element 108 additionally moves in the z-direction. This additional plane of motion enables resonator device 100 to also function as an acceleration or shock sensor. Thus, resonator device 100 comprises an integrated resonator and sensor device.

Figure 2:
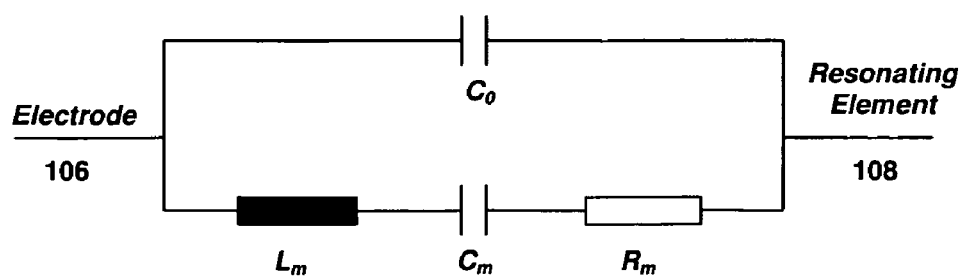
FIG. 2 is a model of the resonating device of FIG. 1.

Resonating devices can be electrically modelled with a Butterworth-van-Dyke model, as depicted in FIG. 2. The series resonant frequency $f_s$ of resonating element 108 is defined by the motional inductance ($L_m$) and capacitance ($C_m$) and in mechanical terms by the stiffness (k) and the mass (m) of resonating element 108.

$$f_s = \frac{1}{2\pi} \frac{1}{\sqrt{L_m C_m}} = \frac{1}{2\pi}\sqrt{\frac{k}{m}}$$

The resonant frequency $f_s$ is therefore not dependant on the area of electrodes 106 and resonating element 108.

In series resonance, the total impedance of the system is related to the motional resistance ($R_m$) of resonating element 108. It can be described by:

$$R_m = \frac{\sqrt{km}}{Q\eta^2}$$

where Q is the quality factor of the resonator and $\eta$ is the so-called electromechanical coupling, which is related to an applied DC-bias voltage ($u_{dc}$), the distance between electrode 106 and resonating element 108 (d) as well as the static capacitance in between ($C_0$).

$$\eta = u_{dc}\frac{C_0}{d}$$

Knowing that the static capacitance $C_0$ is the capacitance of a parallel plate capacitor and that there is no dielectric in the gap, the electromechanical coupling can be expressed as:

$$\eta = u_{dc}\varepsilon_0\frac{A_{el}}{d^2}$$

The motional resistance which governs the impedance in series resonance then becomes:

$$R_m = \frac{\sqrt{km}}{Q\eta^2} = \frac{\sqrt{km}}{Q}\frac{d^4}{A_{el}^2 u_{dc}^2 \varepsilon_0^2}$$

As can be seen above, the motional resistance $R_m$ is inversely proportional to the square of the capacitor area ($A_{el}$). If resonating element 108 is then designed such that it is also sensitive to acceleration in the z-direction, the effective electrode area is changed if resonating element 108 is so accelerated, and the acceleration can be detected.

Figure 3:
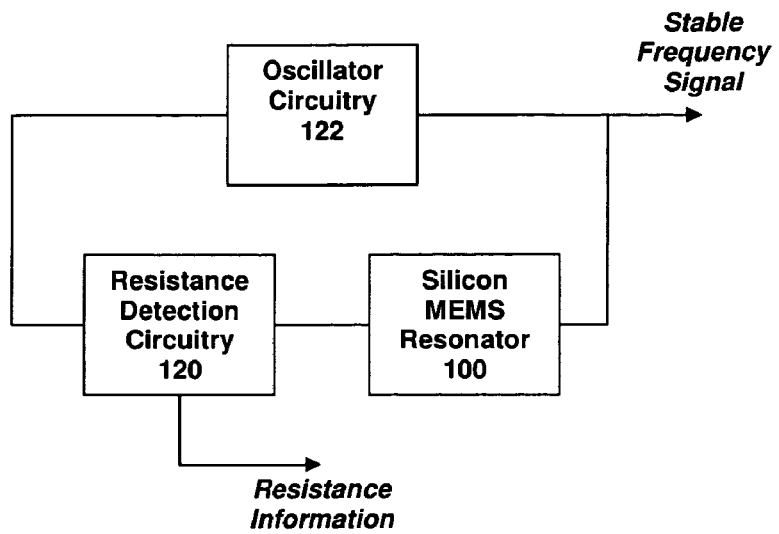
FIG. 3 is a block diagram according to one embodiment.
Figure 4:
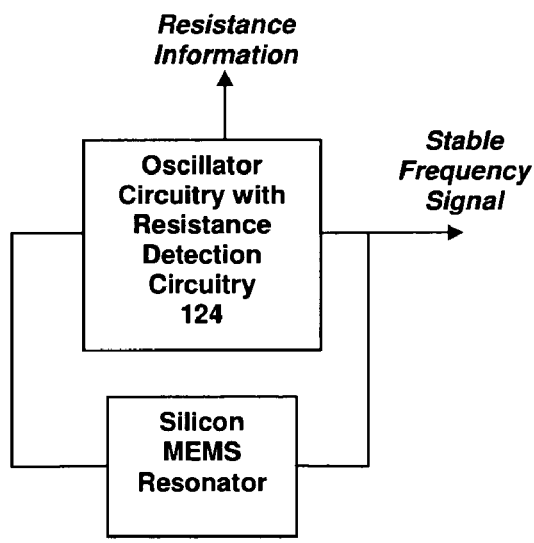
FIG. 4 is a block diagram according to one embodiment.

Referring to FIG. 3, the change in the effective electrode area results in a change in motional resistance which can be detected electronically by resistance detection circuitry 120 coupled to resonator device 100. This resistance information can then be used to determine the acceleration of resonating element 108. Oscillator circuitry 122 coupled to resonator device 100 extracts the stable reference frequency generated by resonator device 100. In another embodiment, and referring to FIG. 4, resistance detection circuitry 120 is integrated with oscillator circuitry 122 at 124. Resistance detection circuitry 120, oscillator circuitry 122 and/or integrated circuitry 124 comprise CMOS or BiCMOS circuitry in various embodiments.

Resonance sensitivity in the z-direction can be accomplished in one embodiment through the design of anchor 112, such as a combination of stiffer and softer materials. In one embodiment, anchor 112 comprises a plurality of material layers. In another embodiment, anchor 112 comprises a shape, configuration and/or structure selected to enable z-direction acceleration.

Figure 5:
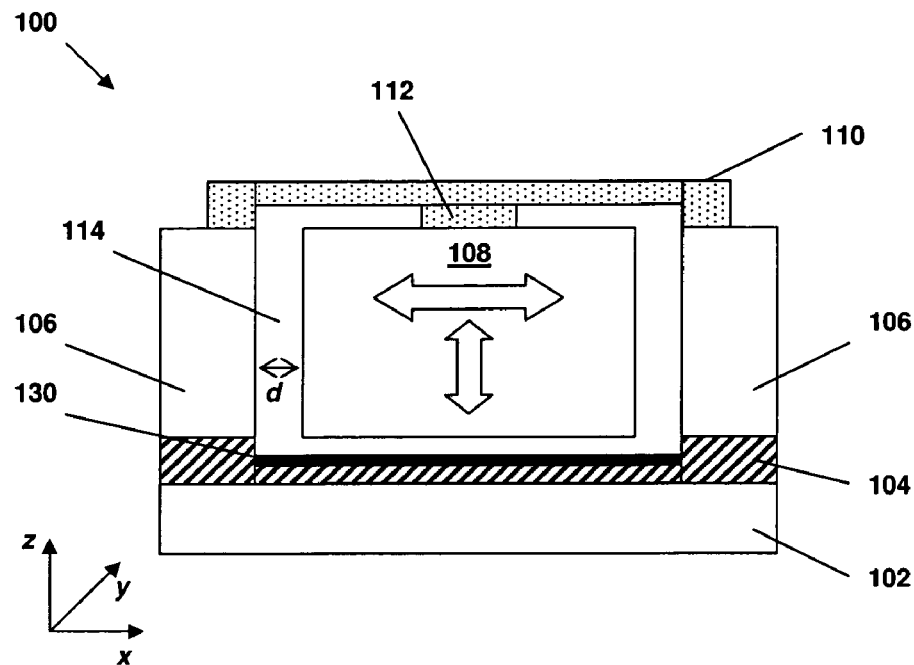
FIG. 5 is a diagram of a resonating device according to one embodiment.

Referring to FIG. 5, another embodiment configured to sense z-direction acceleration in addition to generating a stable reference frequency comprises an additional electrode 130 below resonating element 108 of resonator device 100. Electrode 130 forms a capacitor with resonating element 108. If resonating element 108 is accelerated, in this case the z-direction, the capacitance between resonating element 108 and electrode 130 is altered and can be detected by an electric circuit. As in the previous embodiment, resonance of resonating element 108 in the x-y plane generates a stable reference frequency. Capacitance detection circuitry, oscillator circuitry 122 and/or integrated capacitance and oscillator circuitry can be coupled to resonator device 100, similar to as described above with reference to FIGS. 3 and 4.

One field of application already mentioned for embodiments of resonator device 100 is TPMS. TPMS typically require a stable frequency reference in addition to a sensing element, such as an acceleration or shock sensor. The frequency reference serves as the reference for the system clock of the TPMS ASIC and can also provide the reference for wireless communications between tire-based sensor modules and the vehicle. An acceleration or shock sensor is commonly used for motion or roll detection of the vehicle to provide power-saving wake-up signals.

Figure 6:
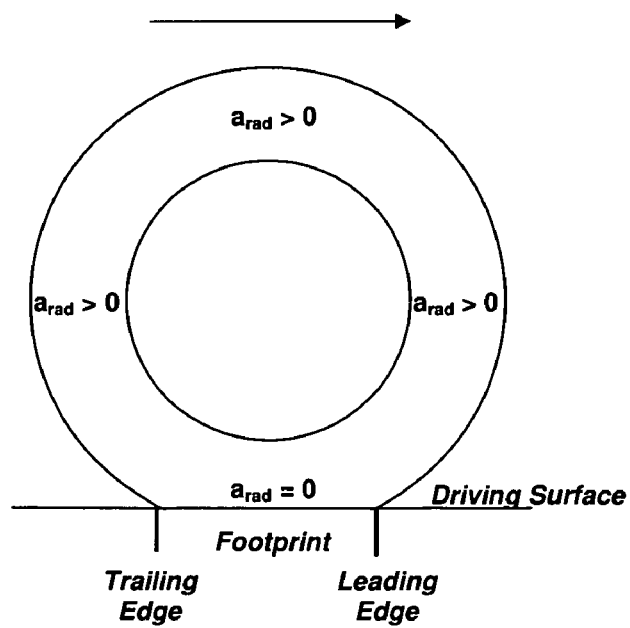
FIG. 6 is a diagram according to one embodiment.

Referring to FIG. 6, shock sensors have additional applicability in new developments of in-tire TPMS, where the shock sensor can be used to measure time between a leading and a trailing edge and therefore to detect the so-called "footprint" or vertical load of each individual tire. In one embodiment, a TPMS wheel module can comprise an embodiment of resonator device 100. The wheel module can be directly integrated in the tire or attached to the inner liner of a tire.

Figure 7:
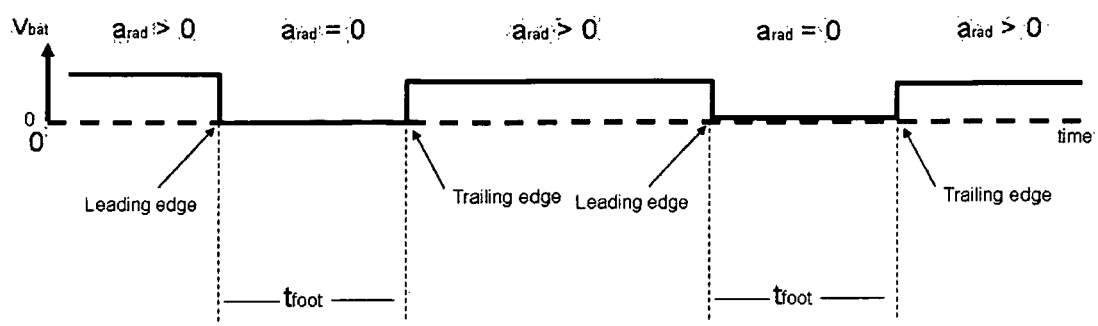
FIG. 7 is a diagram according to one embodiment.

When the wheel is in motion, there are two basic states of acceleration that act on resonating element 108: a first state in which the radial acceleration is greater than zero, and a second state in which the radial acceleration is zero. The second state occurs when the wheel module is in the footprint of the tire, i.e., when the portion of the tire to which the module is mounted is in contact with the driving surface. When the wheel module is not in the footprint area, there is an acceleration in the radial direction due to the rotation of the tire. When the portion of the tire to which the wheel module is mounted comes in contact with the driving surface at the leading edge, the radial acceleration drops down to zero and remains zero until the wheel module leaves the footprint area at the trailing edge. FIG. 7 is a diagram depicting changes in acceleration during rotation of a wheel.

Embodiments of the integrated resonator and sensing device are relevant to any application in which a stable, precise and accurate frequency reference is used in combination with one or more sensors for shock or acceleration detection. In one embodiment, a resonator delivering a stable frequency reference is integrated with a shock or acceleration sensor in a single device by making the resonator sensitive to acceleration in one direction. This direction is generally perpendicular to the direction of movement of the resonator for generating the frequency reference. This integration enables a reduction of discrete devices and therefore saves space on the wafer as well as at the printed circuit board (PCB) level. At the same time, it provides a power savings, which is important for all wireless and ultra low power systems such as TPMS. Further, while some embodiments comprise a single integrated resonator and sensing device, such as resonator device 100, additional embodiments of the invention can comprise a plurality of resonator devices 100 and/or additional resonating and sensing elements.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

The invention claimed is:

1. A silicon micro-electromechanical system (MEMS) device comprising:

a resonating element configured to simultaneously resonate in a first plane of motion to provide a frequency reference and to move in a second plane of motion;

an electrode having an effective area that varies as the resonating element moves in the second plane of motion; and a cavity defining a distance between the electrode and a first side of the resonating element, wherein the distance varies as the resonating element resonates in the first plane.

2. The device of claim 1, further comprising an anchor coupled to the resonating element and configured to enable resonance of the resonating element in the first plane simultaneous with movement of the resonating element in the second plane.

3. The device of claim 2, wherein the anchor comprises a plurality of material layers.

4. The device of claim 2, wherein the anchor comprises a plurality of materials.

5. The device of claim 1, wherein the resonating element is further configured to sense acceleration from movement in the second plane.

6. An integrated resonator and sensor device comprising:

a micro-electromechanical system (MEMS) resonator;

an anchor portion coupled to the MEMS resonator and configured to allow resonance of the MEMS resonator in a first plane of motion and movement of the MEMS resonator in a second plane of motion; and a first electrode spaced apart from the MEMS resonator in the first plane by a distance that varies with resonance of the MEMS resonator in the first plane of motion.

7. The device of claim 6, further comprising a second electrode spaced apart from the MEMS resonator in the second plane.

8. The device of claim 7, wherein the second electrode is spaced apart from the MEMS resonator by a distance that varies with movement of the MEMS resonator in the second plane of motion.

9. The device of claim 7, wherein an insulating layer is disposed between the first electrode and the second electrode.

10. The device of claim 7, further comprising circuitry coupled to the second electrode and configured to detect a capacitance between the MEMS resonator and the second electrode.

11. The device of claim 6, further comprising circuitry coupled to the first electrode and configured to provide a frequency signal output related to resonance of the MEMS resonator in a first plane of motion.

12. The device of claim 6, wherein the resonator comprises silicon.

13. The device of claim 6, wherein the anchor comprises at least one of a plurality of materials and a plurality of layers.

14. A tire pressure monitoring system comprising:

an integrated resonator and sensor device comprising:
 a micro-electromechanical system (MEMS) resonator, and
 an anchor portion coupled to the MEMS resonator and configured to allow resonance of the MEMS resonator in a first plane of motion and movement of the MEMS resonator in a second plane of motion; and circuitry coupled to the integrated resonator and sensor device and configured to determine a frequency reference from the resonance of the MEMS resonator in the first plane of motion and an acceleration of the MEMS resonator from the movement of the MEMS resonator in the second plane of motion.

15. The system of claim 14, wherein the MEMS resonator comprises silicon.

* * * * *